United States Patent
Kok et al.

(10) Patent No.: US 8,339,184 B2
(45) Date of Patent: Dec. 25, 2012

(54) GATE VOLTAGE BOOSTING ELEMENT FOR CHARGE PUMP

(75) Inventors: Chi Wah Kok, Hong Kong (CN); Oi Ying Wong, Hong Kong (CN); Wing Shan Tam, Hong Kong (CN)

(73) Assignee: Canaan Microelectronics Corporation Limited, Hong Kong (CN)

( * ) Notice: Subject to any disclaimer, the term of this patent is extended or adjusted under 35 U.S.C. 154(b) by 133 days.

(21) Appl. No.: 12/915,767

(22) Filed: Oct. 29, 2010

(65) Prior Publication Data

US 2012/0105137 A1    May 3, 2012

(51) Int. Cl.
G05F 3/24    (2006.01)
H02M 3/18    (2006.01)

(52) U.S. Cl. .......................... 327/536; 363/60
(58) Field of Classification Search .................. None
See application file for complete search history.

(56) References Cited

U.S. PATENT DOCUMENTS

| | | | | |
|---|---|---|---|---|
| 6,107,864 | A * | 8/2000 | Fukushima et al. | 327/536 |
| 6,512,413 | B2 * | 1/2003 | Okutsu et al. | 327/543 |
| 6,529,050 | B1 * | 3/2003 | Kuo et al. | 327/112 |
| 7,122,868 | B2 * | 10/2006 | Honda | 257/391 |
| 7,397,299 | B2 | 7/2008 | Ki et al. | |
| 7,564,297 | B2 | 7/2009 | Nonaka | |
| 7,605,640 | B2 | 10/2009 | Ki et al. | |
| 2002/0130704 | A1 * | 9/2002 | Myono et al. | 327/536 |

OTHER PUBLICATIONS

Wong, et al. A Novel Gate Boosting Circuit for 2-Phase High Voltage CMOS Charge Pump. IEEE 978-1-4244-4298-0/09. Last accessed Oct. 30, 2010, 4 pages, 2009.
Ying, et al. Area-Efficient CMOS Charge Pumps for LCD Drivers. IEEE Journal of Solid-State Circuits, vol. 38, No. 10, Oct. 2003, last accessed Oct. 30, 2010, 5 pages.
Nakagome, et al. An experimental 1.5-V 64-Mb DRAM. IEEE Journal of Solid-State Circuits, vol. 26, Issue 4, Apr. 1991, pp. 465-472. http://ieeexplore.ieee.org/xpl/freeabs_all.jsp?arnumber=75040.
Wang, et al. Efficiency Improvement in Charge Pump Circuits. IEEE Journal of Solid-State Circuits, vol. 32, Issue 6, Apr. 1997, pp. 852-860. http://iroi.seu.edu.cn/jssc9697/data/00585287.pdf. Last accessed Jan. 28, 2011, 9 pages.

(Continued)

Primary Examiner — Lincoln Donovan
Assistant Examiner — Terry L Englund
(74) Attorney, Agent, or Firm — Turocy & Watson, LLP

(57) ABSTRACT

Systems, methods, and devices that generate a desired boosted gate voltage to facilitate controlling a charge pump are presented. A multi-phase charge pump (e.g., two-phase CMOS charge pump) can comprise a desired number of switch cells (SCs), wherein each SC can include a gate boost switch control component, which employs two transistors (without the need for external circuitry), and generates a desired gate voltage, based at least in part on a desired clock signal, wherein the desired gate voltage is applied to a charge transfer switch, $M_c$, of the SC to facilitate transferring a voltage across the $M_c$ to a node on the other side of the $M_c$, in each stage of the charge pump, wherein the SCs are associated with a desired number of flying capacitors to facilitate increasing the input voltage to a desired output voltage.

23 Claims, 8 Drawing Sheets

OTHER PUBLICATIONS

Zhang, et al. Integrated Multivalue Voltage-to-Voltage Converter. Proceedings of ICECS '99, the 6th IEEE International Conference on Electronics, Circuits and Systems, 1999, Sep. 5-9, 1999, vol. 1, pp. 335-338. http://ieeexplore.ieee.org/xpl/freeabs_all.jsp?arnumber=812291.

Favrat, et al. A high-efficiency CMOS voltage doubler. IEEE Journal of Solid-State Circuits, vol. 33, Issue 3, Mar. 1998, pp. 410-416. http://iroi.seu.edu.cn/jssc9899/33ssc98/33ssc03/pdf/33ssc03-favrat.pdf. Last accessed Jan. 28, 2011, 7 pages.

Moisiadis, et al. A CMOS charge pump for low voltage operation. The 2000 IEEE International Symposium on Circuits and Systems. Proceedings of ISCAS 2000 Geneva, vol. 5, pp. 577-580. http://ieeexplore.ieee.org/Xplore/login.jsp?url=http://ieeexplore.ieee.org/iel5/6910/18623/00857500.pdf%3Farnumber%3D857500&authDecision=-203.

Ying, et al. Area Efficient CMOS Integrated Charge Pumps. IEEE International Symposium on Circuits and Systems, 2002, vol. 3, pp. 831-834. http://ieeexplore.ieee.org/Xplore/login.jsp?url=http://ieeexplore.ieee.org/iel5/7897/21775/01010353.pdf%3Farnumber%3D1010353&authDecision=-203.

Rincon-Mora, et al. A low-voltage, low quiescent current, low dropout regulator. IEEE Journal of Solid-State Circuits, vol. 33, Issue 1, Jan. 1998, pp. 36-44. http://iroi.seu.edu.cn/jssc9899/33ssc98/33ssc01/pdf/33ssc01-rinconmora.pdf. Last accessed Jan. 28, 2011, 9 pages.

Basu, et al. Simplified Clock Voltage Doubler. Electronics Letters, Issue dated Oct. 28, 1999, vol. 35, Issue 22, pp. 1901-1902. http://ieeexplore.ieee.org/xpl/freeabs_all.jsp?arnumber=811039.

Ueno, et al. Emergency power supply for small computer systems. Proceedings IEEE International Symposium on Circuits and Systems, Jun. 11-14, 1991, vol. 2, pp. 1065-1068. http://ieeexplore.ieee.org/xpl/freeabs_all.jsp?arnumber=176549.

Wu, et al. MOS Charge Pumps for Low-Voltage Operation. IEEE Journal on Solid-State Circuits, pp. 592-597, Apr. 1998. http://www.ics.ee.nctu.edu.tw/~jtwu/publications/pdf/98jssc-cpump.pdf. Last accessed Jan. 28, 2011, 6 pages.

Su, et al. Gate Control Strategies for High Efficiency Charge Pumps. IEEE International Symposium on Circuits and Systems, May 23-26, 2005, vol. 2, pp. 1907-1910. http://ieeexplore.ieee.org/xpl/freeabs_all.jsp?arnumber=1464985.

Makowski. Realizability Conditions and Bounds on Synthesis of Switched-Capacitor DC-DC Voltage Multiplier Circuits. IEEE Transactions on Circuits and System-I, Fundamental theory and applications, pp. 684-691, Aug. 1997. http://www.eti.pg.gda.pl/katedry/ksem/pracownicy/Marek.Makowski/Publikacje/00611263.pdf. Last accessed Jan. 28, 2011, 8 pages.

Starzyk, et al. A DC-DC Charge Pump Design Based on Voltage Doublers. IEEE Transactions on Circuits and System-I, Fundamental theory and applications, vol. 48, No. 3, Mar. 2001. Last accessed Feb. 1, 2011, 10 pages.

Qui. Analog Very Large Scale Integrated Circuits Design of Two-Phase and Multi-Phase Voltage Doublers With Frequency Regulation. Thesis for the degree of Master of Science, Ohio University, Nov. 1999. Last accessed Feb. 1, 2011, 77 pages.

* cited by examiner

GATE VOLTAGE BOOSTING ELEMENT FOR CHARGE PUMP

TECHNICAL FIELD

The subject specification generally relates to electronic circuitry, and, more particularly, to systems, methods, and devices for providing a gate voltage boosting element to generate a desired gate voltage for a charge pump.

BACKGROUND

The switched-capacitor direct current (DC)-DC converter, which is also known as charge pump, is popularly applied to generate different levels of DC voltage other than the supply voltage. The charge pump typically contains switches, capacitors, and clocking circuits, and does not require any transformers or inductors. The charge pump (e.g., multi-phase charge pump) can generate different DC output voltages by transferring charge among the capacitor networks in the charge pump using two or more clock phases. To facilitate generating the different DC output voltages, a number of topologies have been employed for step-up charge pump designs. One of the well-known charge pumps is the Makowski charge pump, which is able to obtain the maximum output voltage with a minimum number of capacitors in a two-phase system. In the Makowski charge pump, metal-oxide-semiconductor field-effect transistor (MOSFET) transistors are biased in the linear region to act as charge transfer switches. Each MOSFET is being turned on and off by applying an appropriate gate voltage to the respective MOSFET. However, the required gate voltages to drive the MOSFET gates are usually higher than the voltage supply. As a result, conventionally, external circuits, such as level shifters and bootstrapping circuits, are applied to generate the desired high voltage clock signals to facilitate applying the desired high gate voltage to the gates of the MOSFETs. Another approach used today is a systematic gate control strategy for high efficiency charge pumps. However, these conventional schemes result in increasing the required silicon area in order to implement the particular scheme as well as increasing the design complexity of the charge pump.

Currently, there is a need to be able to generate a desirably high gate voltage (e.g., a boosted gate voltage that is desirably higher than the supply voltage) to be applied to the gate of the switches (e.g., MOSFETs) in a charge pump while reducing the complexity of the circuit design and the circuit area required to generate the desired gate voltage. The above-described deficiencies of today's gate voltage boosting systems are merely intended to provide an overview of some of the problems of conventional systems, and are not intended to be exhaustive. Other problems with the state of the art and corresponding benefits of some of the various non-limiting embodiments may become further apparent upon review of the following detailed description.

SUMMARY

The following presents a simplified summary of the various embodiments in order to provide a basic understanding of some aspects described herein. This summary is not an extensive overview of the disclosed subject matter. It is intended to neither identify key or critical elements of the disclosed subject matter nor delineate the scope of the subject embodiments. Its sole purpose is to present some concepts of the disclosed subject matter in a simplified form as a prelude to the more detailed description that is presented later.

Systems, methods, and devices that generate and control a desired boosted gate voltage to facilitate controlling a charge pump are presented. In accordance with various aspects, a system can comprise at least one switch cell comprising at least one charge transfer switch (CTS) that is configured to control transfer of a high voltage from a first voltage node across the at least one CTS to a second voltage node in response to a gate voltage applied to a gate of the at least one CTS that turns on the at least one CTS, and at least one gate boosting switch control component (GBSCC) that is configured to control a switch state of the at least one CTS, based at least in part on an applied clock signal, to facilitate control of a switch state of the at least one CTS. In an aspect, the at least one GBSCC can comprise a first switch that is configured to switch on in response to a high clock signal to generate a zero voltage level that is applied to the gate of the at least one CTS to switch the at least one CTS to an on state to facilitate the transfer of the high voltage from the first node to the second node, and is configured to switch off in response to a low clock signal, and a second switch that is configured to switch on when the first switch is switched off, wherein, when the second switch is switched on, the second switch is configured to apply the high voltage at the second node to the gate of the at least one CTS to switch the at least one CTS to an off state. In still another aspect, the at least one GBSCC is configured to control the switch state of the at least one CTS via use of the first switch and the second switch without external circuitry.

In accordance with various other aspects, the subject specification can include a method comprising generating a gate voltage for application to a gate of a first CTS based at least in part on the respective switching states of a first transistor and a second transistor, and applying the gate voltage to the gate of the first CTS to facilitate controlling switching of the first CTS. In an aspect, the method can further comprise applying a high clock signal to a gate of the first transistor, generating the gate voltage for application to the first CTS based at least in part on the high clock signal applied to the gate of the first transistor, and switching off the first CTS in response to the gate voltage applied to the first CTS. In still another aspect, the method can further comprise applying a low clock signal to the gate of the first transistor, switching on the second transistor to facilitate applying a specified voltage to the gate of the first CTS, in response to the first transistor being switched off, and switching off the first CTS in response to the application of the specified voltage to the gate of the first CTS.

In accordance with still other aspects, the subject specification can include a system that can comprise means for generating a gate voltage for application to a gate of a first CTS based at least in part on the respective switching states of a first means for switching and a second means for switching, and means for applying the gate voltage to the gate of the first CTS to facilitate controlling switching of the first CTS. In an aspect, the system can further comprise the first means for switching that switches on in response to a received high clock signal to generate the gate voltage that is applied to the gate of the first CTS to switch the first CTS to an on state to facilitate transfer of a received voltage from a first node associated with the first CTS to a second node associated with the first CTS, wherein the first means for switching switches to an off state in response to a low clock signal, and the second means for switching that switches to an on state when the first switch is switched to the off state, wherein when the second means for switching is switched the on state, the second means for switching applies the received voltage to the gate of the first CTS to switch the first CTS to an off state.

The following description and the annexed drawings set forth in detail certain illustrative aspects of the disclosed subject matter. These aspects are indicative, however, of but a few of the various ways in which the principles of the various embodiments may be employed and the disclosed subject matter is intended to include all such aspects and their equivalents. Other advantages and distinctive features of the disclosed subject matter will become apparent from the following detailed description of the various embodiments when considered in conjunction with the drawings.

DETAILED DESCRIPTION

Figure 1:
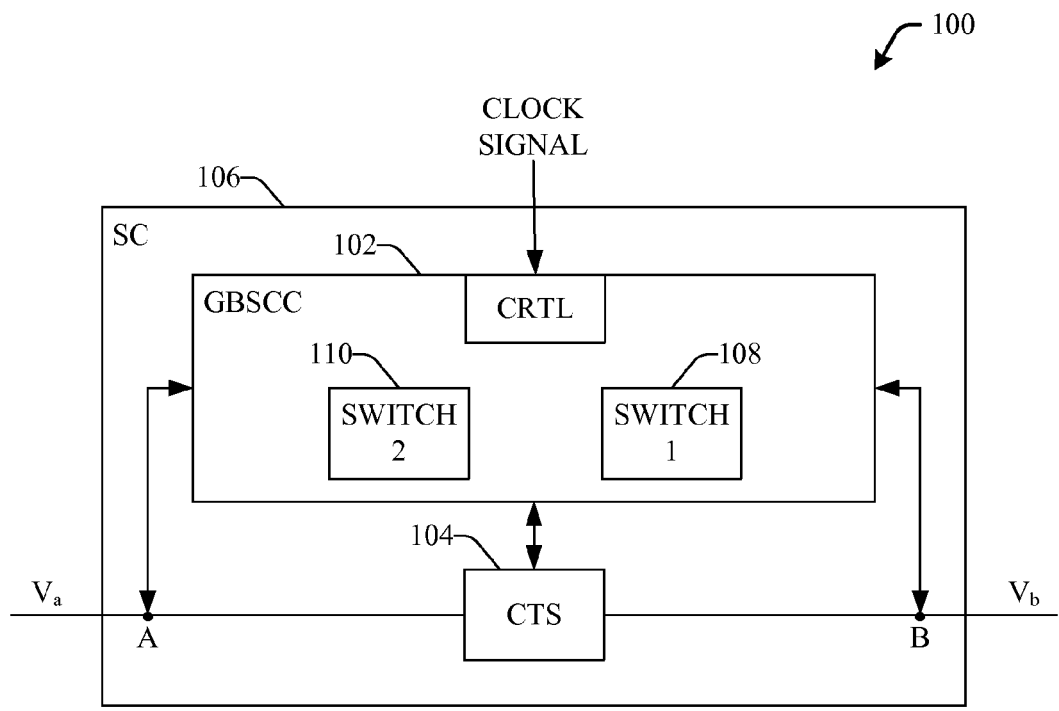
FIG. 1 is a block diagram of an example system that can generate desired gate voltages to facilitate controlling switching associated with a charge pump in accordance with various aspects and embodiments of the disclosed subject matter.

The disclosed subject matter is described with reference to the drawings, wherein like reference numerals are used to refer to like elements throughout. In the following description, for purposes of explanation, numerous specific details are set forth in order to provide a thorough understanding of the various embodiments of the subject disclosure. It may be evident, however, that the disclosed subject matter may be practiced without these specific details. In other instances, well-known structures and devices are shown in block diagram form in order to facilitate describing the various embodiments herein.

As used herein, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

A charge pump is often applied to generate different levels of DC voltage other than (e.g., greater than) the supply voltage. A charge pump typically contains switches, capacitors, and clocking circuits, and does not require any transformers or inductors. The charge pump (e.g., multi-phase charge pump) can generate different DC output voltages by transferring charge among the capacitor networks in the charge pump using two or more clock phases. To facilitate generating the different DC output voltages, a number of topologies have been employed for step-up charge pump designs. One of the well-known charge pumps is the Makowski charge pump, which is able to obtain the maximum output voltage with a minimum number of capacitors in a two-phase system. In the Makowski charge pump, metal-oxide-semiconductor field-effect transistor (MOSFET) transistors, are biased in the linear region to act as charge transfer switches CTSs. Each CTS is being turned on and off by applying an appropriate gate voltage to the respective CTS. However, the required gate voltage to drive the gate of a CTS is usually higher than the voltage supply. As a result, conventionally, external circuits, such as level shifters and bootstrapping circuits, are applied to generate the desired high voltage clock signals to facilitate applying the desired high gate voltage to the gate of the CTS. Another approach used today is a systematic gate control strategy for high efficiency charge pumps. However, these conventional schemes result in increasing the required silicon area in order to implement the particular scheme as well as increasing the design complexity of the charge pump. Currently, there is a need to be able to generate a desirably high gate voltage to be applied to the gates of CTSs in a charge pump at desired times to facilitate controlling switching of the CTSs, while reducing the complexity of the circuit design and the circuit area required to generate the desired gate voltage for the CTSs.

To that end, systems, methods, and devices that generate and control a desired boosted gate voltage to facilitate controlling a charge pump are presented. A multi-phase charge pump (e.g., two-phase complementary metal-oxide-semiconductor (CMOS) charge pump) can comprise a desired number of switch cells (SCs) (e.g., 5 SCs for a 3-stage charge pump, comprising a first stage, a second stage, and a third stage or an output stage), wherein each SC can include a gate boost switch control component (GBSCC), which can employ two transistors, such as transistor $M_a$ and transistor $M_b$ (as further disclosed in the description of the figures), (without the need for external circuitry). The two transistors can be associated with a charge transfer switch (CTS) (e.g., metal-oxide-semiconductor field-effect transistor (MOSFET)), $M_c$ (as further disclosed in the description of the figures), in the SC. One or more clocks can produce desired clock signals, such as clk1 and clk2, wherein clk1 and clk2 can be opposite in phase. Respectively desired clock signals can be applied to the respective SCs in the charge pump.

The two transistors, $M_a$ and $M_b$, of a SC can be configured in the charge pump circuit such that, during certain portions of the clock cycles (e.g., when the clock signal is 'high' at the gate of the $M_a$), the $M_a$ can switch on, which can produce a low gate voltage (e.g., 0V) at the gate of the CTS. As a result, the voltage (e.g., higher voltage) at the node (e.g., node B) on the one side of the CTS can be desirably transferred to the node (e.g., node A) on other side of the CTS. In another aspect, during certain other portions of the clock cycles (e.g., when the clock signal is 'low' at the gate of the $M_a$), the $M_a$ can switch off, the $M_b$ can switch on, and, as a result, a desired gate voltage (e.g., a boosted gate voltage (e.g., $2V_{DD}$ in the first stage, $3V_{DD}$ in the second stage, $5V_{DD}$ in the third stage), which can be obtained from the node on the other side of the CTS via the $M_b$) can be applied to the gate of the CTS and the CTS can switch off in response to the desired gate voltage. As a result, the voltage at the node (e.g., node B) on the one side of the CTS can be blocked from passing through the CTS to the other side of the CTS.

In still another aspect, the charge pump can comprise a desired number of capacitors, based at least in part on the number of stages desired for the charge pump. For example, a 3-stage (3×) charge pump, comprising a first stage, a second stage, and an output stage, can comprise 3 capacitors (e.g., of same or different capacitance values) that can be arranged in parallel with each other in the charge pump circuit, and in parallel with the power supply. The first and second capacitors can be fly capacitors, wherein the first capacitor can be associated with a first SC and a second SC, such that the node A associated with the first SC can be associated with the positive terminal of the first capacitor and the node B associated with the second SC can be associated with the negative terminal of the first capacitor; and the second capacitor can be associated with a third SC and a fourth SC, such that the node A associated with the third SC can be associated with the positive terminal of the second capacitor and the node B associated with the fourth SC can be associated with the negative terminal of the second capacitor. The node B of the third SC can be associated with the positive terminal of the first capacitor (e.g., at the first stage of the charge pump). The node A associated with the fifth SC can be associated with the positive terminal of the third capacitor (e.g., at the output stage of the charge pump) and the node B associated with the fifth SC can be associated with the positive terminal of the second capacitor (e.g., at the second stage of the charge pump). The charge pump also can include other (e.g., two) desired switches respectively associated with the first and second capacitors to facilitate operation of the charge pump. Based at least in part on respective clock signals to the respective SCs (e.g., applying clk1 to the first SC, fourth SC, and fifth SC, and applying clk2 to the second SC and third SC), the charge pump can operate to convert an input voltage (e.g., $V_{DD}$) from the power supply to a desired increased output voltage (e.g., $3V_{DD}$ or approximately $3V_{DD}$).

Figure 4:
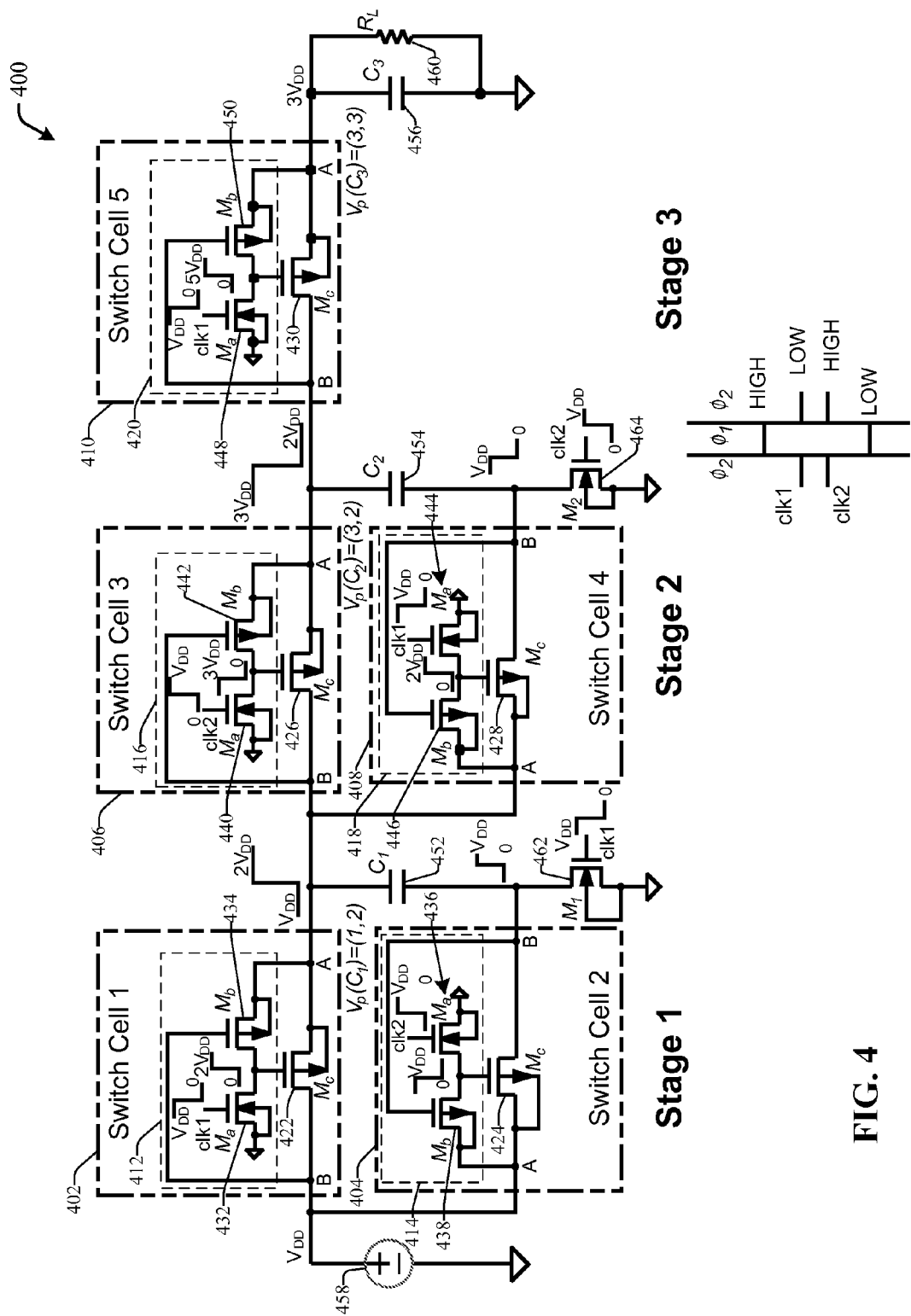
FIG. 4 illustrates a circuit diagram of an example system that employs switch cells with a charge pump in accordance with an embodiment of the disclosed subject matter.

Referring to the drawings, FIG. 1 is a block diagram of an example system 100 that can generate desired gate voltages to facilitate controlling switching associated with a charge pump in accordance with various aspects and embodiments of the disclosed subject matter. In an aspect, the system 100 can include a gate boost switch control component (GBSCC) 102 that can receive a supply voltage, which can be equal to $V_{DD}$), for example, via a desired clock signal (e.g., wherein, when the clock signal is high and thus, equal to $V_{DD}$), and when the clock signal is low, the signal can be equal to 0V), and can generate a desired gate voltage (e.g., a boosted voltage) as an output, wherein, during desired times (e.g., when the clock signal is low), the desired gate voltage can be a higher voltage level than the received supply voltage and can be sufficiently high enough to drive the gate of a charge transfer switch (CTS) 104 (e.g., metal-oxide-semiconductor field-effect transistor (MOSFET) transistor) associated with (e.g., electrically connected to) the GBSCC 102, without requiring any external circuitry, such as, for example, level shifters or boot strapping circuits. The CTS 104 can be associated with (e.g., connected to or part of) a charge pump (e.g., a switched capacitor DC-DC converter, such as a Makowski charge pump) (not shown in FIG. 1; e.g., as shown in FIG. 4). At desired times (e.g., when the clock signal applied to the GBSCC 102 (e.g., at the control node (crtl)) is high), the GBSCC 102 can provide (e.g., apply) the desired gate voltage (e.g., low voltage level (e.g., 0 volts (V)) to turn on the CTS; high voltage level to turn off the CTS) to the gate of a CTS 104 to drive the gate to facilitate switching of the CTS 104 at the desired times to pass a high voltage (e.g., $V_{DD}$, $2V_{DD}$, or $3V_{DD}$, . . . ) from one side (e.g., node A in FIG. 1; node B in SC1 of FIG. 2) to the other side (e.g., node B in FIG. 1; node A in SC1 of FIG. 2) with only a relatively small voltage drop when the CTS 104 turns on. At other desired times (e.g., when the clock signal applied to the crtl of the GBSCC 102 is at a desired high voltage level), the GBSCC 102 can turn off the CTS 104 and can block the higher voltage at node A (in FIG. 1) and thereby prevent that voltage from being transferred to the lower voltage node B (in FIG. 1), with negligible leakage current. In an aspect, the GBSCC 102 and CTS 104 can be part of an overall switch cell (SC) 106. In another aspect, one or more clocks can produce the desired clock signals, such as clk1 and clk2, wherein clk1 and clk2 can be opposite in phase from each other (e.g., clk1 can be at a high voltage level when clk2 is at a low voltage level). Respectively desired clock signals can be applied to the respective SCs in the charge pump.

Figure 3:
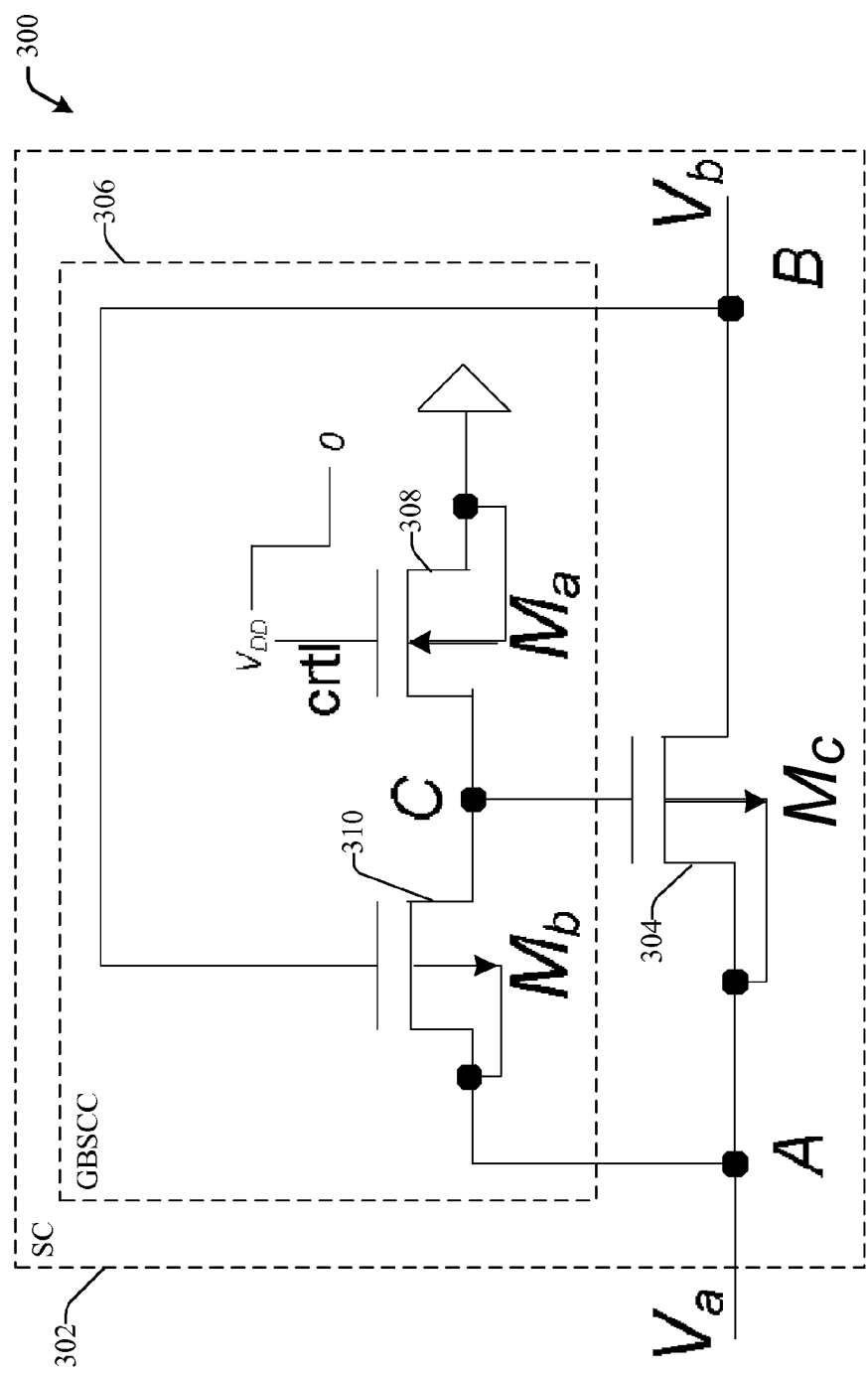
FIG. 3 illustrates a block diagram of an example system that can employ a gate boosting switch cell component to facilitate controlling switching of a CTS for use in a charge pump in accordance with various aspects and embodiments.

In another aspect, to facilitate controlling switching of the CTS 104, the GBSCC 102 can comprise a first switch 108 (e.g., transistor $M_a$, as more fully described herein, for example, with regard to FIGS. 3 and 4), such as a first transistor, and a second switch 110 (e.g., transistor $M_b$, as more fully described herein, for example, with regard to FIGS. 3 and 4), such as a second transistor, that can be configured to turn on the CTS 104 when a high clock signal is applied to the gate of the first switch 108, wherein, in response to the high clock signal, the first switch 108 can turn on and the desired gate voltage (e.g., a desired low gate voltage, such as 0V) can be applied to the gate of the CTS 104. The first switch 108 and the second switch 110 can be further configured to apply a different desired gate voltage (e.g., a high voltage level that is higher than the supply voltage, $V_{DD}$) to turn off the CTS 104 in response to a low clock signal being applied to the first switch 108. It is noted that it is desirable to connect node A to the higher voltage node and node B to the lower voltage node during the time when the CTS 104 is turned off in order to ensure that the switch cell 106 can be shut down properly.

Figure 2:
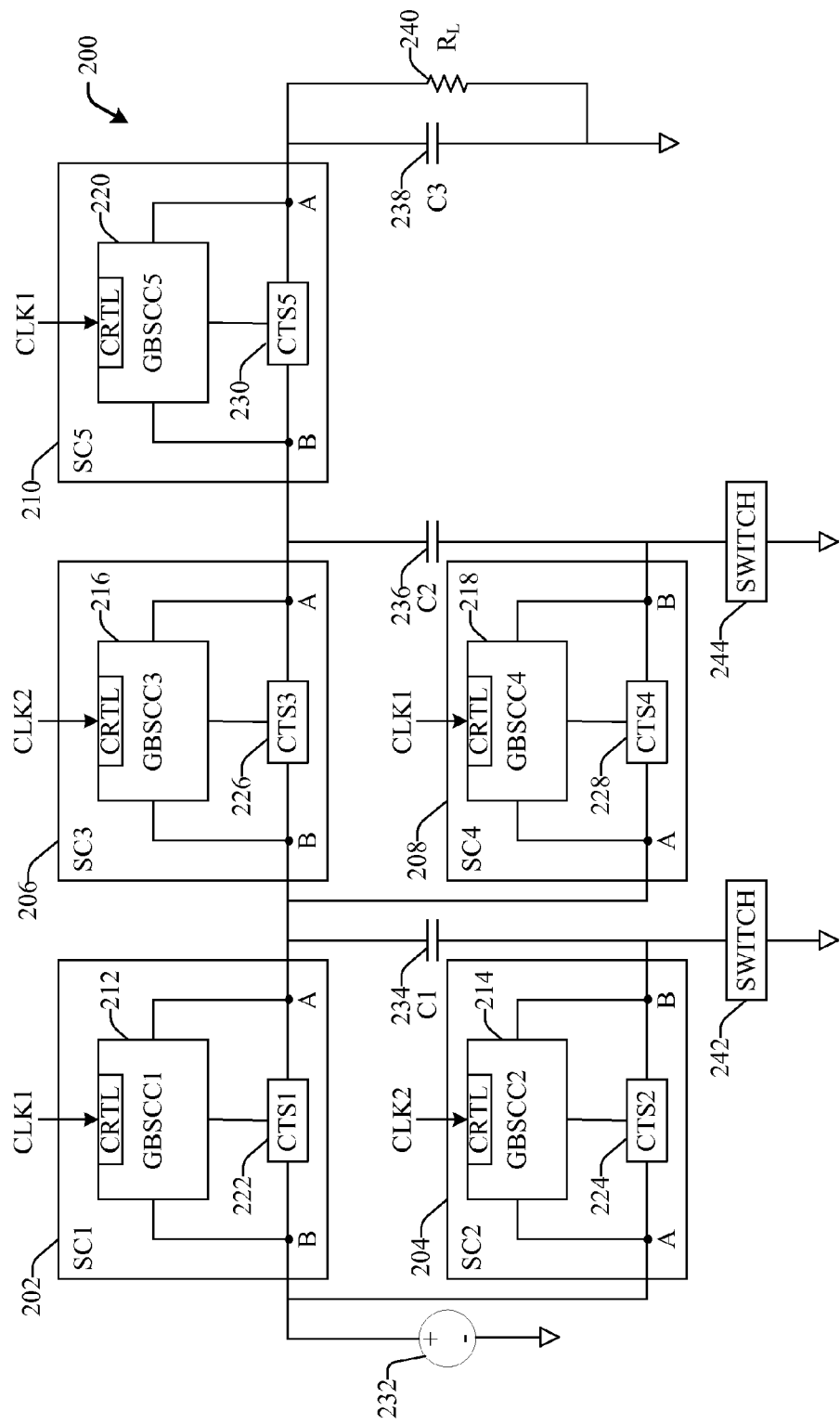
FIG. 2 depicts a block diagram of an example system that can generate desired gate voltages to facilitate controlling switching of charge transfer switches (CTSs) associated with a charge pump to generate a desired voltage in accordance with various aspects and embodiments of the disclosed subject matter.

Referring to FIG. 2, depicted is a block diagram of an example system 200 that can generate desired gate voltages to facilitate controlling switching of CTSs associated with a charge pump to generate a desired output voltage (e.g., increased or stepped-up voltage) in accordance with various aspects and embodiments of the disclosed subject matter. The system 200 can comprise a desired number of SCs, including SC1 202, SC2 204, SC3 206, SC4 208, and SC5 210, that can be respectively configured and switched to facilitate controlling a charge pump, such as a switched-capacitor type charge pump (e.g., multi-phase charge pump). For instance, SC1 202 and SC2 204 can form a first cascade stage, SC3 206 and SC4 208 can form a second cascade stage that can be connected to and cascaded with the first cascade stage, and SC5 210 can be part of an output stage that can be connected to and cascaded with the second cascade stage. Each of the SCs can comprise respective GBSCCs, including GBSCC1 212, GBSCC2 214, GBSCC3 216, GBSCC4 218, and GBSCC5 220, and respective CTSs, including CTS1 222, CTS2 224, CTS3 226, CTS4 228, and CTS5 230, wherein the respective GBSCCs can facilitate controlling switching of the respective CTSs with which the respective GBSCCs are associated to facilitate controlling the charge pump. The SCs, GBSCCs, and CTSs, each can be the same or similar as, and/or can comprise the same or similar functionality as, respective components, as more fully described herein.

In an aspect, the system 200 can comprise a power supply 232 that can provide a desired voltage level (e.g., supply voltage), $V_{DD}$, to desired components of the system 200, including the respective SCs. In another aspect, SC1 202, SC3 206, and SC5 210 can be configured such that their respective inputs can be associated with respective node Bs, and their respective outputs can be associated with respective node As, to facilitate transfer of the voltage at the respective node Bs to the respective node As when the respective SCs (e.g., 202, 206, 210) are turned on. In still another aspect, SC2 204 and SC4 208 can be configured such that their respective inputs can be associated with respective node As, and their respective outputs can be associated with respective node Bs. In the arrangement of system 200, SC1 202, SC4 208, and SC5 210 can receive a first clock signal (clk1) at their respective control inputs (e.g., ctrl nodes), and SC2 204 and SC3 206 can receive a second clock signal (clk2) at their respective control nodes (e.g., crtl nodes), wherein clk1 can operate opposite from clk2 (e.g., clk1 and clk2 can be oppositely phased) such that at a given first time or first time period, the clk1 can be at a high level while the clk2 can be at a low level, and during a second time or second time period, the clk1 can be at a low level while the clk2 can be at a high level. For instance, the respective clock levels of clk1 and clk2 can respectively change between low level and high level at respective periodic times, as desired. This arrangement of the SCs 202, 204, 206, 208, and 210 can facilitate ensuring that the node As are connected to the higher voltage nodes and the node Bs are connected to the lower voltage nodes during the times when the respective SCs are shut down (e.g., switched off) to facilitate ensuring that the respective SCs are shut down properly.

At desired times (e.g., when the respective clock signal applied to the crtl of the respective GBSCC is at a high voltage level), the respective GBSCCs, GBSCC1 212, GBSCC2 214, GBSCC3 216, GBSCC4 218, and GBSCC5 220 can respectively generate a desired gate voltage (e.g., a desired low gate voltage, such as 0V) as an output at respective desired times, based at least in part on the respective clock signals (e.g., clk1, clk2) applied to the respective GBSCCs, to turn on the respective CTSs, CTS1 222, CTS2 224, CTS3 226, CTS4 228, and CTS5 230. For instance, with regard to CTS1 222, CTS3 226, and CTS5 230, when such CTS is turned on, the voltage at their respective node B can be transferred across the respective CTS to their respective node A.

At other desired times (e.g., when the respective clock signal applied to the crtl of the respective GBSCC is at a 'low' voltage level), the respective GBSCCs (e.g., 212, 214, 216, 218, 220) can generate a desired high gate voltage (e.g., a voltage level that is higher than the supply voltage, $V_{DD}$, (e.g., $2V_{DD}$, $3V_{DD}$, $5V_{DD}$) and is sufficient enough to drive the gate of the respective CTS) that can be applied to respective gates of the respective CTSs to turn off the respectively associated CTSs (e.g., 222, 224, 226, 228, 230), without requiring any external circuitry, such as, for example, level shifters or boot strapping circuits. For instance, when CTS1 222, CTS3 226, or CTS5 230, is turned off, the voltage at the respective node Bs can be blocked from being transferred to the respective node As on the other side of the respective CTS, with negligible leakage current.

In an aspect, to facilitate converting an input voltage level to a desired output voltage having a desired higher voltage level (e.g., higher than the input voltage), the system 200 can comprise a desired number of capacitors, including, for example, capacitor C1 234, capacitor C2 236, and capacitor C3 238, which can have respective desired capacitance values that can be the same or different from each other, as desired. In accordance with an embodiment, the system 200, as depicted, can be a 3-stage (3×) charge pump, such as a 3-stage (3×) Makowski charge pump, that can convert an applied voltage, $V_{DD}$, to produce 3 times, or approximately 3 times, the input voltage as an output (e.g., input voltage=$V_{DD}$ resulting in an output voltage≈$3V_{DD}$). The capacitors, such as C1 234, C2 236, and C3 238, can be arranged in the circuit in parallel with each other, and in parallel with the power supply 232.

As an example of the voltage conversion produced by the charge pump, in this charge pump, the capacitor C1 234 (e.g., flying capacitor) can be coupled to CTS 222 and CTS 224 between the input power supply 232 and the output. During one clock half cycle, which can be the charging half cycle, the capacitor C1 234 can couple in parallel to the input power supply 232 and can be charged up to the input voltage, $V_{DD}$. During a second clock cycle, the transfer half cycle, the charged capacitor C1 234 can couple in series with the input voltage, $V_{DD}$, from the power supply 232 to provide an output voltage (e.g., at the node A where the input voltage and the voltage output from the capacitance meet) that can be twice the level (e.g., $2V_{DD}$), or approximately twice the level, of the input voltage, $V_{DD}$. As desired, there can be a desired number of additional charge pump stages (e.g., a total of 3 stages in the depicted system 200) that can produce a desired stepped-up output voltage (e.g., approximately $3V_{DD}$ in the depicted system 200) in a similar fashion as the above example.

That is, each flying capacitor (e.g., a capacitor with switches connected to both of its terminals) in the 2-phase switched-capacitor charge pump comprises the charging and pumping phases. During the charging phase, the positive terminal of the flying capacitor, such as C1 234, can be charged by a voltage, such as charge voltage $V_c$, which can be equal to $V_{DD}$, while its negative terminal can be connected to the ground. In the pumping phase, the negative terminal of the flying capacitor, such as C1 234, can be pumped by a voltage, $V_p$ (e.g., which can be at or close to $V_{DD}$), which can be the voltage stored in the flying capacitor. Therefore, a voltage sum which is equal to $V_c + V_p$, which can be approximately equal to $2V_{DD}$, can appear at the positive terminal of the flying capacitor (e.g., C1 234) during its pumping phase.

In FIG. 2, the system 200 comprises an example of a 3× Makowski charge pump, which can be a charge pump topology that can obtain the highest output voltage with minimum number of capacitors in 2-phase system. Defining clk1 and clk2 to be the two opposite phase clock signals, where clk1 is 'high' and clk2 is 'low' during the time period φ1 and in the time period φ2, clk1 can be 'low' and clk2 can be 'high'. The notation $V_p(C_k)=(V_{\phi 1}(C_k), V_{\phi 2}(C_k))$ can be used to denote the ratio of the voltages at the positive terminal of the k-th capacitor, $C_k$, respected to $V_{DD}$ during the two time periods φ1 and φ2 throughout the subject specification. The first element $V_{\phi 1}(C_k)$ represent the node voltage ratio respected to $V_{DD}$ at the positive terminal of the k-th capacitor during φ1 while the second element $V_{\phi 2}(Ck)$ can represent that during φ2.

The performance of the charge pump can significantly depend on the CTSs 222, 226, and 230. It can be desirable for the CTSs 222, 226, and 230 to have a relatively small on-resistance to reduce the amount of power loss and the voltage drop across the CTSs 222, 226, and 230, as such voltage drop can result in voltage drop at the charge pump output. Moreover, it is desirable for the CTSs 222, 226, and 230 to be able to shut down completely when turned off to prevent charge flowing back from the output.

Both NMOS and PMOS transistor implementations of switches can have their respective problems. The NMOS transistor implementation can be easily shut down by applying a gate voltage, $V_{g,Mn}=0$ V. However, the NMOS implementation typically requires a $V_{g,Mn}$ higher than $V_{d,Mn}+V_{th,Mn}$ for the NMOS transistor to transfer a high voltage at its drain with small drain to source voltage drop, $V_{ds,Mn}$. On the other hand, the PMOS transistor can be easily turned on by applying a gate voltage, $V_{g,Mp}=0$. When the PMOS transistor is turned on, the high voltage at its source, $V_{s,Mp}$, can be passed to its drain with a very small voltage drop, $V_{sd,Mp}$. However, a voltage level that is relatively close to the higher voltage between its drain and source is desirable (e.g., required) to achieve negligible leakage current. Disregarding the aforementioned deficiency of PMOS transistors, they are frequently applied to construct charge transfer switches in switched-capacitor charge pumps due to their high efficiency in charge transfer at high voltage.

Turning to FIG. 3, illustrated is an example system 300 that can employ a GBSCC to facilitate controlling switching of a CTS for use in a charge pump (e.g., switched-capacitor charge pump) in accordance with various aspects and embodiments. In system 300, node A and node B can be the two terminals of the SC 302 that desirably can be connected to the charge pump circuit just like an ordinary switch but with directionality, and the crtl node can desirably be connected to the clock signal (e.g., clk1 or clk2) that can drive the SC 302 with correct phase. Inside the SC 302, the CTS 304 ($M_c$), which can be connected between node A and node B, can comprise a gate that can be driven by the gate voltage generated by the GBSCC 306 connected thereto. In an aspect, the GBSCC 306 can comprise a first transistor 308 ($M_a$) and a second transistor 310 ($M_b$) that can be configured to facilitate generating the desired gate voltage at desired times based at least in part on the clock signal applied to the crtl node, wherein the controlled application of the desired gate voltage to the gate of the CTS 304 can facilitate desirably controlling switching of the CTS 304. In another aspect, the SC 302 can pass a high voltage from one side of the SC 302 to the other side of the SC 302 (e.g., from node A to node B) with small voltage drop when the SC 302 turns on (e.g., switches to an on state). Moreover, the SC 302 can block the high voltage at node A with negligible leakage current when the SC 302 turns off or shuts down (e.g., switches to an off state). To turn on the SC 302, a 'high' clock signal (e.g., which can be equal to $V_{DD}$) can be applied to the gate of the first transistor 308, wherein the gate of the first transistor 308 can be associated with the crtl node of the SC 302. If a 'low' clock signal (e.g., which can be equal to 0V) is applied at the crtl node, the SC 302 can switch off the CTS 304 (e.g., the second transistor 310 can apply or transfer a high gate voltage, $V_a$, to the CTS 304 to switch it off) and can block the higher voltage at node A, and prevent it from transferring to the lower voltage node B on the other side of the SC 302. Note that it is desirable for node A to be connected to the higher voltage node and for node B to be connected to the lower voltage node during the times when the SC 302 is shut down, in order to ensure that the SC 302 can be shut down properly.

In accordance with various aspects, the operation of the SC 302 is as follows. To turn on the CTS 304, the clock signal that applies the clock voltage to the gate of the first transistor 308 can be 'high' (e.g., crtl=$V_{DD}$). In response to the received 'high' voltage at its gate, the first transistor 308 can turn on and a desired low gate voltage (e.g., 0V) can appear at node C, which can be associated with the gate of the CTS 304, and can thereby turn on the CTS 304. As a result, the higher voltage between nodes A and B can be transferred to the other side of the SC 302 (e.g., transferred from node A to node B in FIG. 3). If $R_{DS,ON}$ of the CTS 304 (e.g., the resistance of the drain-source when the CTS 304 is switched on) is relatively small such that $|V_a-V_b|<|V_{th,Mb}|$, the second transistor 310 can turn off by connecting the gate and source of the second transistor 310 to node B and node A, respectively. To turn off the CTS 304, the clock signal that is applied to the gate of the first transistor 308 can be 'low' (e.g., crtl=0V). In response to the 'low' voltage level at the gate of the first transistor 308, the first transistor 308 can turn off or shut down. If the gate of the second transistor 310 is connected to node B, which can be at a lower voltage than the voltage level at node A during this clock phase, the second transistor 310 can turn on and transfer the voltage, $V_a$, (which can be approximately equal to $2V_{DD}$) to node C, associated with the gate of the CTS 304. In response to the gate of the CTS 304 having the voltage, $V_a$, applied thereto, the CTS 304 can turn off (e.g., shut down completely), which can prevent a reverse current through the CTS 304. It is desirable for the voltage difference between $V_a$ and $V_b$ to be larger than a desired threshold amount of voltage such that the second transistor 308 can turn on and the SC 302 can be completely shut down. It is noted that, during the time period when the CTSs in the charge pump (e.g., Makowski charge pump) should be shut down, the voltage differences across the CTSs are typically larger than $V_{DD}$, and thus, it is easy to fulfill the above requirements in charge pump applications.

To achieve high voltage conversion efficiency, it can be desirable to avoid having the p-n junctions of the transistors in the charge pump being forward biased, as this can result in the current leakage to the bulks of the transistors. With regard to SC 302, it can be observed that, with the first transistor 308 being an NMOS transistor, the first transistor 308 can be free from such a problem since its body always can be connected to the lowest voltage node in the circuit in system 300. In another aspect, with the second transistor 310 being a PMOS transistor, the p-n junctions of the second transistor 310 always can be connected in reverse bias since its body is always connected to the higher voltage node between its source and drain regardless of whether the crtl is 'high' or 'low' (e.g., regardless of whether the voltage at the ctrl node is at a high voltage level or low voltage level). In still another aspect, the CTS 304 can have its p-n junctions connected to be reverse biased when it is turned off or shut down. This is due in part to the CTS 304, when it is shut down, having its body connected to the higher voltage node between its drain and source. However, when the CTS 304 is turned on and a high voltage is passed from node B to node A, there can exist an instance that the p-n junction at node B and the body of the CTS 304 can be forward biased. To minimize the leakage current of the CTS 304 in this situation, the $R_{DS,ON}$ of the CTS 304 can be small enough under a defined loading current range such that the voltage drop between node A and node B can be smaller than the junction potential of the p-n junction. This can effectively prevent the p-n junctions from being completely turned on.

With regard to the SC 302, there is a potential issue that can arise, wherein, in certain instances, there can be a direct DC path through the second transistor 310 and the first transistor 308. This can occur, for example, at the rising edge of the clock signal at the ctrl node, and thus, the gate, of the first transistor 308. At that moment, the CTS 304 is being turned on and node B is being charged by node A. During a clock cycle, there will be a time instance where $V_b<(V_a-V_{th,Mb})$. As a result, the second transistor 310 is not completely shut down and thus current can flow through the first transistor 308 and the second transistor 310 to the ground. To reduce or minimize this loss in efficiency, it is desirable for the respective transistor sizes of the second transistor 310 and the first transistor 308 to be relatively small to reduce the current flowing through them during those time instances. At the same time, it is also desirable for the respective transistor sizes of the second transistor 310 and the first transistor 308 to be chosen to be large enough to turn on the CTS 304 rapidly. This design paradox can be resolved by choosing a relatively large size first transistor 308 to increase the overdrive voltage of the CTS 304, and limit the leakage current by using a relatively small size second transistor 310. As a result, the node B can be charged at a relatively fast rate and the second transistor 310 can be closed rapidly.

Note that, at desired times, the SC 302 can be used to transfer a high voltage without any, or at least with virtually no, threshold voltage drop. At the same time, at other desired times, the SC 302 can be shut down completely to prevent, or at least minimize, any reverse current. Moreover, the SC 302 can be easily turned on and off by applying a desired clocking signal that swings from 'low' (e.g., 0V) to 'high' (e.g., $V_{DD}$) only without relying on the node voltages generated in the previous stages. Therefore, the SC 302 is suitable to be used as a switch for implementation in small area high voltage switched-capacitor charge pumps, for instance, as disclosed herein (e.g., with regard to FIGS. 2 and 4).

Referring again briefly to FIG. 2, the system 200 can have an input of $V_{DD}$ and can produce a constant voltage of $3V_{DD}$, or approximately $3V_{DD}$, as an output, wherein the output voltage can be extracted from the voltage potential across the output-stage capacitor, C3 238. The system 200, comprises a charge pump that can contain 3 cascading stages, and the last stage can be the output stage (e.g., third stage) where a loading resistor 240 ($R_L$) can be connected. In comparing with the block diagram of the system 200 comprising a 3× charge pump, it can be observed that the CTSs, CTS1 222, CTS2 224, CTS3 226, CTS4 228, and CTS5 230, can be respectively controlled by the SCs, SC1 202, SC2 204, SC3 206, SC4 208, and SC5 210, based at least in part on the respective clock signals, clk1 and clk2, that can be applied to the respective SCs. In an aspect, SC1 202 of stage 1 of the charge pump and SC3 206 of stage 2 of the charge pump can be utilized to pass the charging voltage to the positive terminals of C1 234 and C2 236 at time periods φ1 and φ2, respectively. In another aspect, SC2 204 and SC4 208 can be utilized to pass the pumping voltage to the negative terminals of C1 234 and C2 236 at stages 1 and 2 during their pumping phases φ2 and φ1, respectively. In still another aspect, the system 200 can include a first switch 242 associated with C1 234 and a second switch 244 that can be associated with C2 236. In an aspect, the first switch 242 and second switch 244 can respectively connect the negative terminals of C1 234 and C2 236 of stages 1 and 2 to the ground during their respective charging phases. In an embodiment, since the switches 242 and 244 are only responsible for passing a low voltage, such as 0V, the switches 242 and 244 can be implemented using NMOS transistors.

In an aspect, the terminal A of each SC (e.g., 202, 204, 206, 208, 210) can be connected to the node A that is the higher voltage node, and the terminal B of each SC can be connected to the lower voltage node, when the respective SC turns off (e.g., shuts down). As shown in the system 200 in FIG. 2, the connections of the SCs are structured in accordance with the above terminal connections, such that SC1 202 can have its node B connected to the power supply 232, and the other odd number indexed SCs, such as SC3 206 and SC5 210, can have their respective node B connected to the flying capacitor of the previous stages (e.g., node B of SC3 206 can be connected to C1 234, and node B of SC5 210 can be connected to C2 236), and the respective node A of the odd number indexed SCs (e.g., SC1 202, SC3 206, SC5 210) can be connected to the flying capacitor of the corresponding stage (e.g., node A of SC1 202 can be connected to C1 234, node A of SC3 206 can be connected to C2 236, node A of SC5 210 can be connected to C3 238). In another aspect, the even number indexed SCs, SC2 204 and SC4 208, can have their respective node A respectively connected such that the node A of SC2 204 can be connected to the power supply 232, and the node A of SC4 208 can be connected to the flying capacitor, C1 234, of the previous stage, and their respective node B can connected to the flying capacitor of the corresponding stage such that the node B of SC2 204 can be connected to C1 234 and node B of SC4 208 can be connected to C2 236. This connecting topology can be generalized to a higher voltage gain charge pump.

Since a high voltage is passed from the respective node Bs to the respective node As of the SC1 202, SC3 206, and SC5 210 when those SCs respectively turn on, the respective CTSs, CTS1 222, CTS3 226, and CTS5 230, inside the respective SCs potentially can suffer from the leakage current problem due in part to the forward biased p-n junctions of the CTSs, as disclosed herein. As a result, the design (e.g., respective selection of the second transistors ($M_b$) (not shown in FIG. 2; e.g., as shown in FIGS. 3 and 4) and first transistors ($M_a$) (not shown in FIG. 2; e.g., as shown in FIGS. 3 and 4) of the respective GBSCCs 212, 214, 216, 218, and 220) of system 200 can be such that it ensures that the respective node voltages at the respective positive terminals of C1 234, C2 236, and C3 238 will not drop below $V_{DD}-V_{forward,p-n}$, $2V_{DD}-V_{forward,p-n}$, and $3V_{DD}-V_{forward,p-n}$, respectively, when the SC1 202, SC3 206, and SC5 210 are respectively turned on during the steady state operation of the charge pump, wherein $V_{forward,p-n}$ refers to the forward voltage drop of the p-n junction in the associated CMOS process. As a result, the efficiency of the charge pump can be desirably maintained. Conversely, failure to do so can reduce the efficiency of the charge pump. On the other hand, SC1 202, SC3 206, and SC5 210 will not suffer from the direct DC path problem at the rising edge of the ctrl signals, as disclosed herein (e.g., with regard to system 300 in FIG. 3).

SC2 204 and SC4 208 also will not suffer from a leakage current problem caused by the forward biased p-n junctions of the respective second transistors ($M_b$) and first transistors ($M_a$), because the high voltage is passed from the respective node As to the respective node Bs in these SCs when the respective SCs are turned on. Therefore, the bulks of the respective CTSs, CTS2 224 and CTS4 228, in these SCs (e.g., SC2 204, SC4 208) are always connected to the highest voltage node in these respective SCs. In an aspect, to reduce or minimize the risk that SC2 204 and/or SC4 208 will suffer from a direct DC path problem at the rising edge of the ctrl applied to these SCs, the size of the respective second transistors ($M_b$) in SC2 204 and SC4 208 can be selected to be relatively small to facilitate limiting the amount of leakage current during this transition time. Moreover, the size the first transistors ($M_a$) can be selected to be relatively large to facilitate increasing the overdrive voltage of the respective CTSs, CTS2 224 and CTS4 228, such that respective node Bs of SC2 204 and SC4 208 can be charged by the respective node As of SC2 204 and SC4 208 quickly.

FIG. 4 illustrates a circuit diagram of an example system 400 that employs switch cells with a charge pump (e.g., 3× Makowski charge pump) in accordance with an embodiment of the disclosed subject matter. The system 400 can comprise a desired number of SCs, such as SC1 402, SC2 404, SC3 406, SC 408, and SC 410, wherein the SCs can respectively comprise GBSCC1 412, GBSCC2 414, GBSCC3 416, GBSCC4 418, and GBSCC5 420, and also can respective comprise CTS1 422 ($M_c$), CTS2 424 ($M_c$), CTS3 426 ($M_c$), CTS4 428

($M_c$), and CTS5 430 ($M_c$), wherein the respective GBSCCs can facilitate controlling the respective CTSs, based at least in part on respective clock signals, clk1 and clk2, applied to the respective SCs, to facilitate controlling the charge pump and converting an input voltage to a desired higher output voltage. SC1 402 and SC2 404 can form the first stage (e.g., first pre-output stage), SC3 406 and SC4 408 can form the second stage (e.g., second or subsequent pre-output stage), and SC5 410 can form the third stage (e.g., output stage). Each of the GBSCCs can respectively include a first transistor ($M_a$) and second transistor ($M_b$), wherein GBSCC1 412 can comprise a first transistor 432 ($M_a$) and second transistor 434 ($M_b$), GBSCC2 414 can comprise a first transistor 436 ($M_a$) and second transistor 438 ($M_b$), GBSCC3 416 can comprise a first transistor 440 ($M_a$) and second transistor 442 ($M_b$), GBSCC4 418 can comprise a first transistor 444 ($M_a$) and second transistor 446 ($M_b$), and GBSCC5 420 can comprise a first transistor 448 ($M_a$) and second transistor 450 ($M_b$).

In another aspect, the system 400 can include a desired number of capacitors, such as C1 452, C2 454, and C3 456, that can be employed to facilitate converting the input voltage, $V_{DD}$, from power supply 458 to produce a desired output voltage of $3V_{DD}$, or approximately $3V_{DD}$, that can be applied to the loading resistor 460. The system 400 also can contain a switch 462 (e.g., NMOS transistor) that can be associated with C1 452 and switch 464 (e.g., NMOS transistor) that can be associated with C2 454. The respective components (e.g., SCs, GBSCCs, CTSs, capacitors, power supply 458, resistor 460, switch 462, switch 464) of system 400 each can be the same as, and/or can comprise the same or similar functionality as, respective components as described herein (e.g., with regard to system 100, system 200, and system 300).

At desired times (e.g., when the respective clock signal applied to the crtl of the respective GBSCC is at a 'high' voltage level), the respective GBSCCs, GBSCC1 412, GBSCC2 414, GBSCC3 416, GBSCC4 418, and GBSCC5 420 can respectively generate a desired gate voltage (e.g., a desired low gate voltage, such as 0V) that can be output and applied to respective gates of the respectively associated CTSs (e.g., MOSFETs), CTS1 422, CTS2 424, CTS3 426, CTS4 428, and CTS5 430, to facilitate respectively switching on the respective CTSs to facilitate transferring a voltage across the respective CTSs to the other side of the respective CTSs.

At other desired times (e.g., when the respective clock signal applied to the crtl of the respective GBSCC is at a 'low' voltage level), the respective GBSCCs (e.g., 412, 414, 416, 418, 420) can turn off the respectively associated CTSs (e.g., 422, 424, 426, 428, 430) and can block the higher voltage at a respective node (e.g., node B associated with CTS1 422) on one side of the CTS to thereby prevent that voltage from reaching the respective node (e.g., node A associated with CTS 422) on the other side of the CTS, with negligible leakage current. In an aspect, to facilitate switching off a particular CTS (e.g., CTS1 422), in response to a 'low' voltage level from the low clock signal applied to the gate of the first transistor (e.g., 432) associated with that CTS, the first transistor can switch off, and the second transistor (e.g., 434) can switch on, wherein, in response, another desired gate voltage (e.g., a boosted or higher voltage, for example, $2V_{DD}$, $3V_{DD}$, or $5V_{DD}$) can be provided to the gate and can be sufficiently high enough to drive the gate of the associated CTS (e.g., CTS1 422) to switch the CTS off, without requiring any external circuitry (e.g., level shifters, boot strapping circuits, etc.).

In an aspect, the capacitors, C1 452, C2 454, and C3 456, which can have respective desired capacitance values (e.g., same or different capacitance values), can be arranged in the circuit in parallel with each other, and in parallel with the power supply 458, and can be employed to facilitate converting an input voltage level, $V_{DD}$, to a desired higher output voltage (e.g., $3V_{DD}$ or approximately $3V_{DD}$). In another aspect, the switch 462 (M1) and switch 464 (M2) can respectively connect the negative terminals of C1 452 and C2 454 of stages 1 and 2 to the ground during their respective charging phases. In an embodiment, since the switches 462 and 464 are only responsible for passing a low voltage, such as 0V, the switches 462 and 464 can be implemented using NMOS transistors.

To demonstrate the effectiveness of the proposed charge pump, the 3× Makowski charge pump in FIG. 4 was designed and simulated in SMIC 0.18 μm CMOS process, in accordance with one preferred embodiment of the disclosed subject matter. The threshold voltage of the PMOS and NMOS are approximately −0.42V and 0.45V, respectively. The supply voltage for the simulation is 1V. All the capacitors, C1 452, C2 454, and C3 456, are 0.5 μF and the loading resistor 460 has a resistance value of 10 kΩ and is connected to the third stage (e.g., output stage) of the charge pump. The respective sizes of the transistors (e.g., $M_a$, $M_b$, $M_c$, M1, M2) for the system 400 in the simulation are listed in Table I. The sizes of transistors $M_a$ and $M_b$ in the SCs are 45 μm/0.18 μm and 15 μm/0.22 μm, respectively. As disclosed herein, the size of $M_a$ can be larger than that of $M_b$ to facilitate increasing the overdrive voltage of $M_c$. The maximum allowable current flows through $M_a$ and $M_b$ to the ground can be limited by the small PMOS $M_b$.

TABLE 1

| SC1, SC3 | $M_a$ | $M_b$ | $M_c$ |
|---|---|---|---|
| μm/μm | 45/0.18 | 15/0.22 | 250/0.22 |
| SC2, SC4 | $M_a$ | $M_b$ | $M_c$ |
| μm/μm | 45/0.18 | 15/0.22 | 1000/0.22 |
| SC5 | $M_a$ | $M_b$ | $M_c$ |
| μm/μm | 45/0.18 | 15/0.22 | 100/0.22 |
| M1 | 250 μm/0.18 μm | | |
| M2 | 250 μm/0.18 μm | | |

Since the maximum current that is allowed to flow through a PMOS with size 15 μm/0.22 μm is approximately 7 milliamps (mA) (with $V_{sg}$=3V) the leakage current is limited to this value. Although this leakage current can be quite large, the direct DC path to the ground is only formed during the short transition time of the clock signal. Therefore, the charge leakage can be very small. A smaller size can be chosen for $M_a$ and $M_b$ to minimize the loss, however, this will slow down the speed for closing and opening the CTSs, $M_c$. The sizes of the charge transfer switches $M_c$ in each SC can be relatively large to reduce $R_{DS,ON}$. This can reduce the voltage drop at the charge pump output, and thus the power loss of the charge pump. The largest $R_{DS,ON}$ of the CTSs used in the charge pump is approximately 40Ω (for the size of PMOS=250 μm/0.22 μm, $V_{gs}$=1V), which is small enough for a loading current of about a few hundred μA. The clock frequency in the simulation is 125 kHz, with transition time of 5 nanoseconds (ns).

Figure 5:
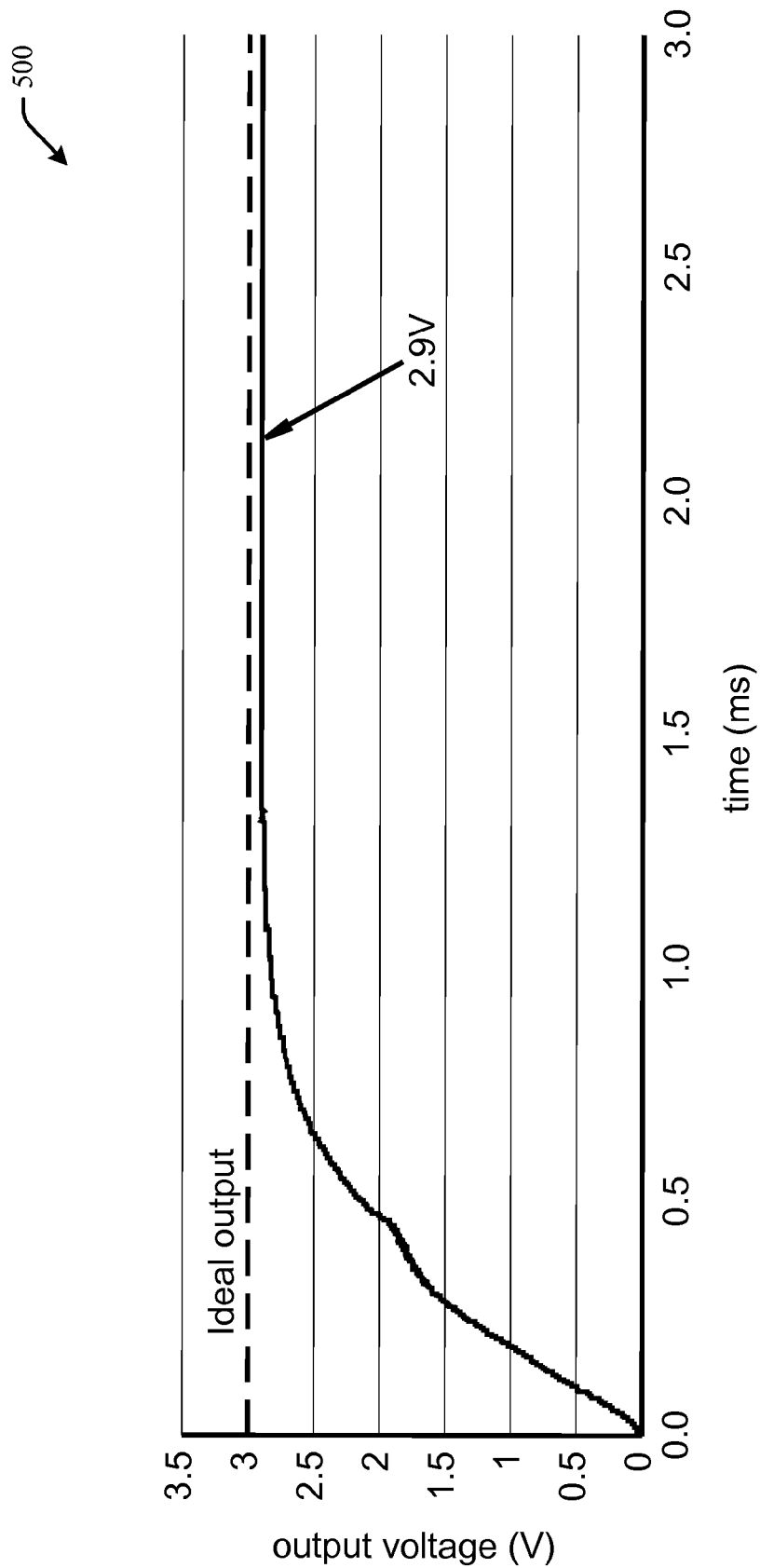
FIG. 5 illustrates a diagram of an example graph of a transient simulation of the simulation of a charge pump system.

Referring briefly to FIG. 5 (along with FIG. 4), depicted is a diagram of a graph 500 of a transient simulation of the simulation of the system 400. The transient simulation of the charge pump is performed by Spectre. The voltage of the capacitor C3 456 in the output stage when it is charged from 0V is shown in the graph 500. The final output voltage is approximately 2.9V with a loading current of 290 μA. The output voltage is very close to the ideal output voltage, which is 3V. The high output voltage is due to the small $R_{DS,ON}$ of the CTSs and the small leakage and reverse current of the charge pump. The conversion efficiency of the charge pump given by (power consumption of the loading resistor/input power)× 100% is approximately 88.8%, without including the power consumption due to the clock signals clk1 and clk2. The loss in conversion efficiency is mainly due to the charging and discharging of the nodes during the transition time, the power loss on the $R_{DS,ON}$ of the CTSs while conducting, and the leakage and reverse current in the charge pump. The high efficiency shows that the power loss due to these factors is relatively small.

This desirable result demonstrates the effectiveness of the disclosed switch cell used in switched-capacitor charge pump application. With the use of the disclosed switch cell, the reverse and leakage current problems in the switched-capacitor charge pump are reduced or minimized, as compared to conventional charge pumps. This can increase the voltage gain of the high voltage charge pump design. Moreover, the disclosed switch cell can transfer the high voltage effectively without any, or at least with virtually no, threshold voltage drop. Note that the desirable results can be obtained without the use of any external circuits (e.g., level shifter circuits, bootstrapping circuits) to provide the desired (e.g., necessary) clock signals, which can reduce the design complexity. Moreover, the disclosed GBSCC (e.g., gate boosting element) only requires two small transistors, which can reduce the chip area of the designed charge pump, and reduce cost (e.g., reduced component cost, reduced cost for implementing on the chip, etc.) in implementing the charge pump, as compared to conventional charge pumps.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

It is to be appreciated and understood that, while the charge pump has been described herein as being a 3-stage charge pump, the subject specification is not so limited, as in accordance with various other embodiments, the charge pump can comprise less than three stages or more than three stages, as desired, wherein the charge pump can include the desired CTSs and GBSCCs to facilitate operation of the charge pump. For example, a charge pump can have two cascading stages, comprising a pre-output stage (e.g., first stage) and an output stage, wherein a received input voltage (e.g., $V_{DD}$) can be converted to two times or at least approximately two times the input voltage (e.g., equal or approximately equal to $2V_{DD}$); or a charge pump can have four cascading stages, comprising 3 pre-output stages and an output stage, wherein a received input voltage (e.g., $V_{DD}$) can be converted to five times or at least approximately five times the input voltage (e.g., equal or approximately equal to $5V_{DD}$); or a charge pump with more than four stages, wherein the voltage level produced by the output stage is a function of the number of stages in the charge pump and the input voltage, for example, in accordance with a Fibonacci number sequence: 1, 2, 3, 5, 8, 13, 21, 34, 55, 89, 144, 233... (e.g., output voltage level≈input voltage level×N, wherein N is the number in the Fibonacci number sequence corresponding to the number of stages, S, such that when S=2, N=2, when S=3, N=3, when S=4, N=5, when S=5, N=8, ...).

It is to be further appreciated and understood that, while some of the example systems disclosed herein have described MOSFETs used as switches, the subject specification is not so limited, as in accordance with various embodiments and aspects, virtually any desired type of electronic switch, such as a semiconductor switch device, can be employed to facilitate desired switching, for example, in relation to desired converting of an input voltage to a desired output voltage. For example, a switch (e.g., switch 1, switch 2, CTS, $M_a$, $M_b$, $M_c$, M1, M2, ...) can be another type of field-effect-transistor (FET) (e.g., junction FET (JFET), insulated gate bipolar transistor (IGBT), metal-semiconductor FET (MESFET)), bipolar junction transistor (BJT), or other type of transistor.

Figure 6:
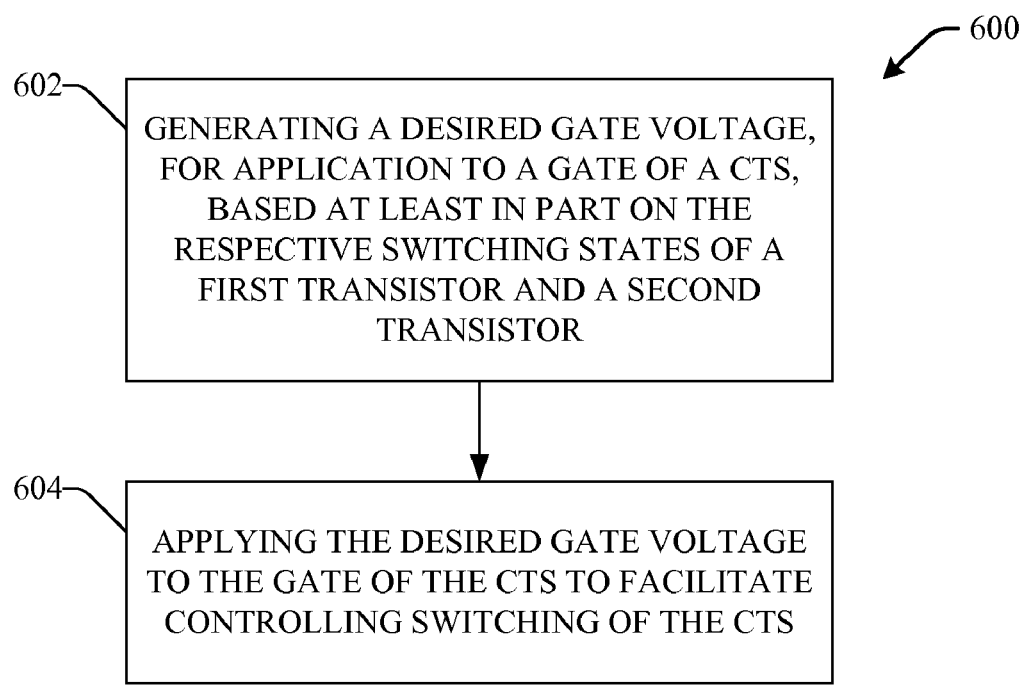
FIG. 6 illustrates a flowchart of an example method for controlling switching of a CTS(s) to facilitate producing a desired output voltage in accordance with various aspects and embodiments of the disclosed subject matter.
Figure 7:
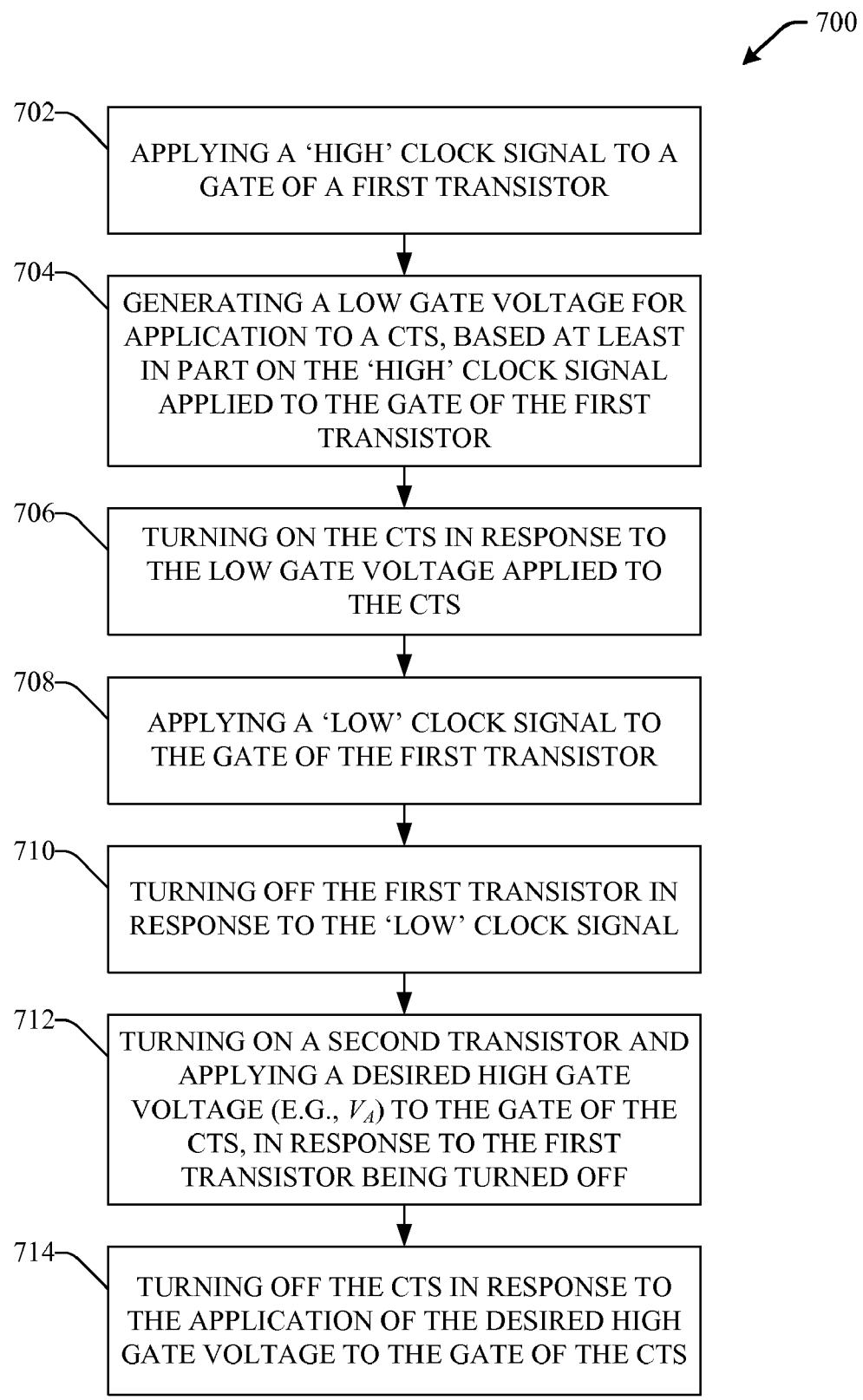
FIG. 7 depicts a flowchart of an example method that can facilitate controlling switching of a CTS(s) to facilitate producing a desired output voltage in accordance with various aspects and embodiments of the disclosed subject matter.
Figure 8:
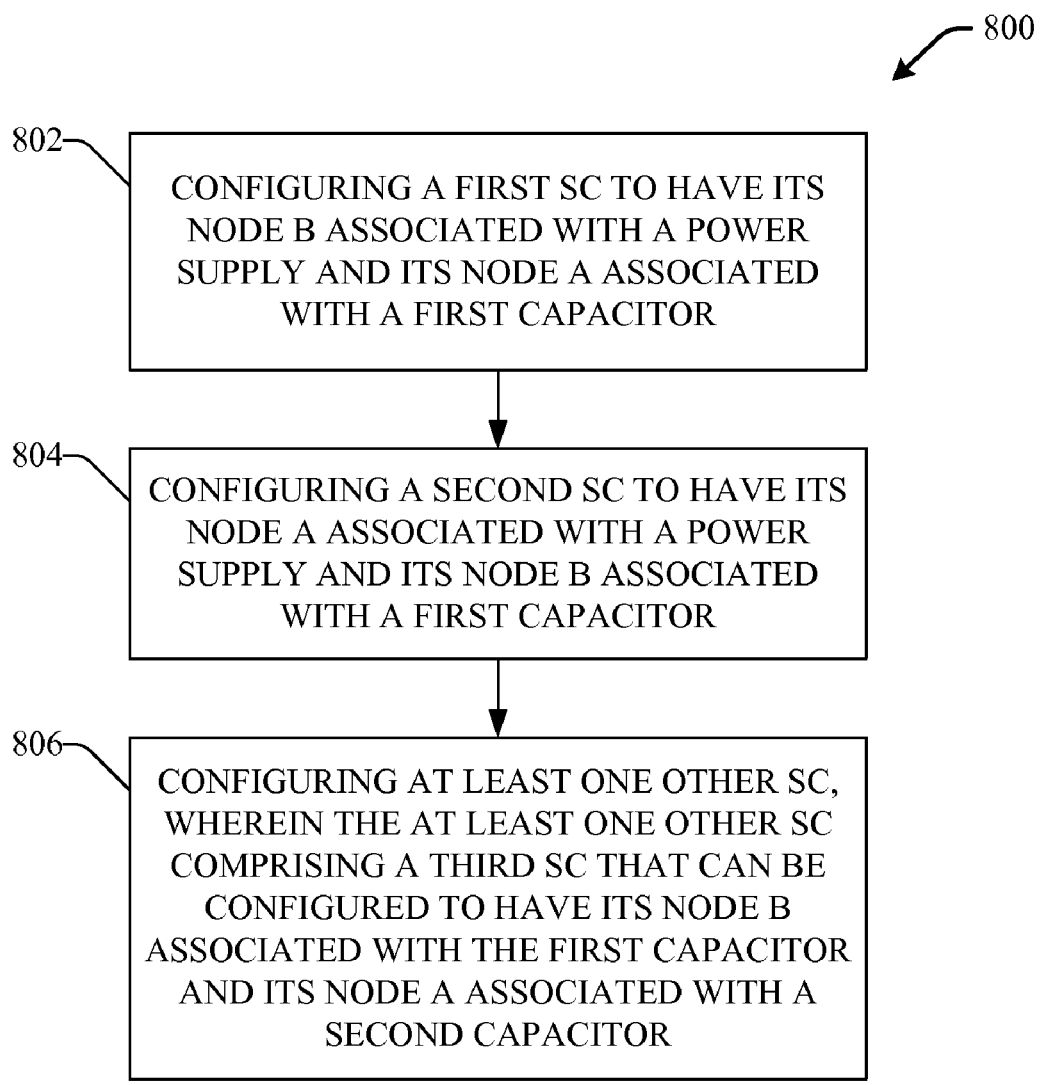
FIG. 8 illustrates a flowchart of an example method for configuring a charge pump in accordance with various aspects and embodiments of the disclosed subject matter.

In view of the example systems and/or devices described herein, example methodologies that can be implemented in accordance with the disclosed subject matter can be better appreciated with reference to flowcharts in FIGS. 6-8. For purposes of simplicity of explanation, example methodologies disclosed herein are presented and described as a series of acts; however, it is to be understood and appreciated that the disclosed subject matter is not limited by the order of acts, as some acts may occur in different orders and/or concurrently with other acts from that shown and described herein. For example, a method disclosed herein could alternatively be represented as a series of interrelated states or events, such as in a state diagram. Moreover, interaction diagram(s) may represent methodologies in accordance with the disclosed subject matter when disparate entities enact disparate portions of the methodologies. Furthermore, not all illustrated acts may be required to implement a method in accordance with the subject specification.

FIG. 6 presents a flowchart of an example method 600 for controlling switching of a CTS(s) to facilitate producing a desired output voltage in accordance with various aspects and embodiments of the disclosed subject matter. The method 600 can be employed with a charge pump to facilitate converting an input voltage (e.g., $V_{DD}$) to a desired increased output voltage (e.g., equal to or approximately equal to $3V_{DD}$). At 602, a desired gate voltage, for application to a gate of a CTS, can be generated based at least in part on the respective switching states of a first transistor and a second transistor. For instance, a GBSCC can include the first transistor ($M_a$) and second transistor ($M_b$), wherein the first and second transistors can be configured in a circuit to facilitate generating a desired gate voltage that, at desired times (e.g., when the clock signal applied to the gate of the first transistor is at a 'high' voltage level (e.g., $V_{DD}$)), can be a low voltage level, such as 0V or another desired predefined low voltage level, to turn on (e.g., switch on) the CTS to facilitate transferring voltage across the CTS, and, at other desired times (e.g., when the clock signal applied to the gate of the first transistor is at a 'low' voltage level), the GBSCC can generate a sufficiently high enough gate voltage to drive the gate of the CTS ($M_c$) to switch off the CTS and thereby prevent voltage from passing across the CTS, without requiring any external circuitry (e.g., level shifter circuit, bootstrapping circuit), as more fully disclosed herein.

At 604, the desired gate voltage can be applied to the gate of the CTS to facilitate controlling switching of the CTS. In an aspect, at the desired times (e.g., when the clock signal is 'high'), the GBSCC can apply a low voltage level (e.g., 0V) to the gate of the CTS to facilitate turning on the CTS, and, at the other desired times (e.g., when clock signal is low'), the GBSCC can output a desired gate voltage, which can be higher than the voltage from the power supply and can be sufficient to drive the gate of the CTS to turn the CTS off, as more fully disclosed herein. One or more CTSs can be employed in a charge pump (e.g., switched-capacitor charge pump) to facilitate converting an input voltage to a desired (e.g., higher) output voltage.

FIG. 7 illustrates a flowchart of another example method 700 that can facilitate controlling switching of a CTS(s) to facilitate producing a desired output voltage in accordance with various aspects and embodiments of the disclosed subject matter. At 702, a 'high' clock signal can be applied to a gate of a first transistor. At 704, a low gate voltage for application to a CTS can be generated based at least in part on the 'high' clock signal applied to the gate of the first transistor. At 706, the CTS can turn on (e.g., switch on) in response to the low gate voltage applied to the CTS. In an aspect, the 'high' clock signal at the gate of the first transistor can turn on the first transistor, which can result in a low voltage level, such as 0V, appearing at node C associated with the gate of the CTS, wherein the low voltage level applied to the gate of the CTS can turn on the CTS. In response to turning on the CTS, the higher voltage between nodes A and B, which can be respectively associated with terminals A and B of the CTS, can be passed to from the higher voltage side (e.g., node B associated with SC1 of FIG. 4) to the lower voltage side (e.g., node A associated with SC1 in FIG. 4).

At 708, a 'low' clock signal can be applied to the gate of the first transistor. At 710, the first transistor can turn off in response to the 'low' clock signal. At 712, a second transistor can turn on and apply a desired high gate voltage (e.g., $V_a$) to the gate of the CTS, in response to the first transistor being turned off. The desired high gate voltage can be sufficiently high enough (e.g., approximately $2V_{DD}$) to drive the gate of the CTS to facilitate turning the CTS off. At 714, the CTS can turn off in response to the application of the desired high gate voltage to the gate of the CTS. As a result, the CTS can be shut down completely, which can prevent a reverse current from flowing through the CTS. As desired, in accordance with method 700, the clock can continue to send clocks signals to the SC, including the first transistor therein, to facilitate desired switching of the CTS.

FIG. 8 illustrates a flowchart of an example method 800 for configuring a charge pump in accordance with various aspects and embodiments of the disclosed subject matter. At 802, a first SC can be configured to have its node B associated with a power supply and its node A associated with a first capacitor. In an aspect, a first clock signal (e.g., clk1) can be provided to the crtl node (e.g., associated with the gate of the first transistor ($M_a$)) of the first SC.

At 804, a second SC can be configured to have its node A associated with a power supply and its node B associated with a first capacitor. In an aspect, a second clock signal (e.g., clk2) can be provided to the crtl node (e.g., associated with the gate of the first transistor ($M_a$)) of the first SC.

At 806, at least one other SC can be configured, wherein the at least one other SC can comprise a third SC that can be configured to have its node B associated with the first capacitor and its node A associated with a second capacitor. In an aspect, the second clock signal can be provided to the crtl node (e.g., associated with the gate of the first transistor ($M_a$)) of the first SC. In accordance with various embodiments, if there are three SCs in the charge pump, the charge pump can include a first stage and an output stage, wherein an input voltage of $V_{DD}$ can produce an output voltage of approximately $2V_{DD}$ from the charge pump output; however, if, for example, there are five SCs in the charge pump, the charge pump can include a first stage, a second stage, and an output stage, wherein an input voltage of $V_{DD}$ can produce an output voltage of approximately $3V_{DD}$ from the charge pump output, as more fully disclosed herein.

Based at least in part on the respective clock signals (e.g., clk1, clk2) applied to the crtl nodes of the respective SCs, the switching of the SCs can be desirably controlled to facilitate converting the input voltage to the desired stepped-up output voltage (e.g., approximately $2V_{DD}$, approximately $3V_{DD}$), based at least in part on the number of stages in the charge pump, as more fully disclosed herein.

It is to be appreciated and understood that components (e.g., switches, SC, GBSCC, CTS, clock, capacitors, power supply, resistor, etc.), as described with regard to a particular system or method, can include the same or similar functionality as respective components (e.g., respectively named components or similarly named components) as described with regard to other systems or methodologies disclosed herein. Various aspects or features described herein may be implemented as a method, apparatus, or article of manufacture using standard programming and/or engineering techniques.

What has been described above includes examples of systems and methods that provide advantages of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:
1. A system, comprising:
a charge pump comprising:
a plurality of switch cells that are configured in relation to each other to form a specified number of cascading charge pump stages comprising one or more pre-output stages and an output stage, wherein switch cells of the plurality of switch cells respectively include a node A and a node B; and
a plurality of capacitors including at least a first pre-output stage capacitor and an output-stage capacitor,
wherein a first pre-output stage of the one or more pre-output stages includes a first switch cell and a second switch cell of the plurality of switch cells, and the first pre-output stage capacitor, and the node A of the first switch cell of the first pre-output stage is connected to the node B of the second switch cell of the first pre-output stage through the first pre-output stage capacitor,
wherein the output stage is connected to at least one of the first pre-output stage or, a subsequent pre-output stage, and the output stage includes an output-stage switch cell connected to the output-stage capacitor, to facilitate generation of an output voltage,
wherein at least the first switch cell comprises:
at least one charge transfer switch (CTS) configured to control transfer of a high voltage from the node B across the at least one CTS to the node A in response to a gate voltage applied to a gate of the at least one CTS that turns on the at least one CTS, and
at least one gate boosting switch control component (GBSCC) configured to apply the gate voltage to the gate to control a switch state of the at least one CTS, based at least in part on an applied clock signal, to facilitate control of the switch state of the at least one CTS to control the transfer of the high voltage from the node B across the at least one CTS to the node A.

2. The system of claim 1, wherein the at least one GBSCC comprises:
a first switch that is configured to switch on in response to a high clock signal value from the applied clock signal to generate a zero voltage level that is applied to the gate of the at least one CTS to switch the at least one CTS to an on state to facilitate the transfer of the high voltage from the node B to the node A, and is configured to switch off in response to a low clock signal value from the applied clock signal; and
a second switch that is configured to switch on when the first switch is switched off, wherein, when the second switch is switched on, the second switch is configured to apply the high voltage at the node A to the gate of the at least one CTS to switch the at least one CTS to an off state.

3. The system of claim 2, wherein the at least one GBSCC is configured to control the switch state of the at least one CTS via use of the first switch, the second switch and the applied clock signal.

4. The system of claim 2, wherein at least one of the first switch or the second switch is a semiconductor switch device.

5. The system of claim 4, wherein the first switch is a n-channel metal-oxide-semiconductor field-effect transistor (NMOS transistor), and the second switch is a p-channel metal-oxide-semiconductor field-effect transistor (PMOS transistor).

6. The system of claim 5, wherein the first switch is further configured to be connected in reverse bias by having its body connected to a lower voltage node of the first switch cell, and the second switch is further configured to be connected in reverse bias by having its body connected to a higher voltage node of the first switch cell, and the higher voltage node has a higher voltage than the lower voltage node.

7. The system of claim 4, wherein the at least one of the first switch or the second switch is at least one of a field-effect-transistor (FET)-type of transistor or a bipolar junction transistor (BJT), wherein the FET-type of transistor comprises at least one of a metal-oxide-semiconductor field-effect transistor (MOSFET), a junction FET (JFET), metal-semiconductor FET (MESFET), or an insulated gate bipolar transistor (IGBT).

8. The system of claim 2, wherein the first switch is a first transistor and the second switch is a second transistor, and the first transistor is larger in size than the second transistor.

9. The system of claim 8, wherein size of the first transistor is sufficiently larger in size relative to the second transistor such that an overdrive voltage associated with the at least one CTS is increased to at least a predefined voltage level and leakage current is limited to be below a predefined current level.

10. The system of claim 1, wherein the at least one CTS is at least one semiconductor switch device.

11. The system of claim 10, wherein the at least one semiconductor switch device is a field-effect-transistor (FET)-type of transistor that comprises at least one of a metal-oxide-semiconductor field-effect (MOSFET) transistor, a junction FET (JFET), metal-semiconductor FET (MESFET), or an insulated gate bipolar transistor (IGBT).

12. The system of claim 1,
wherein the plurality of switch cells are configured in relation to each other to form the specified number of cascading charge pump stages, comprising the one or more pre-output stages that each include corresponding first and second switch cells of the plurality of switch cells, and the output stage that includes the output-stage switch cell of the plurality of switch cells,
wherein each pre-output stage of the one or more pre-output stages comprises the first switch cell and the second switch cell and further comprises the node A and the node B, and the output stage comprises the output-stage switch cell, the node A and the node B,
wherein, for each pre-output stage of the one or more pre-output stages, the node A of the first switch cell of the corresponding pre-output stage is connected to the node B of the second switch cell of the corresponding pre-output stage through the pre-output stage capacitor associated with the corresponding pre-output stage,
wherein the first pre-output stage is connected to another stage, the another stage is one of a subsequent pre-output stage of the one or more pre-output stages or the output stage,
wherein the node A of the first switch cell of the first pre-output stage is connected to the node B of the first switch cell of the another stage,
wherein the node B of the output-stage switch cell of the output stage is connected to the node A of the first switch cell of a previous stage, the previous stage is one of the first pre-output stage or the subsequent pre-output stage, and wherein the node A of the output-stage switch cell of the output stage is connected to a first terminal of the output-stage capacitor, wherein a second terminal of the output-stage capacitor is connected to ground.

13. The system of claim 12, wherein, for each of one or more odd-numbered charge pump stages comprising the first pre-output stage, the first switch cell of an odd-numbered charge pump stage is configured to receive a first clock signal and the second switch cell, if any, of the odd-numbered charge pump stage is configured to receive a second clock signal, and, for each of one or more even-numbered charge pump stages, the first switch cell of an even-numbered charge pump stage is configured to receive the second clock signal and the second switch cell, if any, of the even-numbered charge pump stage is configured to receive the first clock signal, wherein the second clock signal has an opposite phase than the first clock signal.

14. The system of claim 12, wherein, in response to an input voltage, the output voltage is produced by the output stage, wherein the output voltage is extracted from the voltage potential across the output-stage capacitor attached to the node A of the output stage, wherein voltage level of the output voltage is a function of a number of stages in the charge pump and the input voltage.

15. A method, comprising:
initiating a first pre-output stage of a charge pump, wherein the first pre-output stage comprises a first switch cell, a second switch cell, and a first pre-output stage capacitor, the first switch cell and the second switch cell respectively include a node A and a node B, and the node A of the first switch cell is connected to the node B of the second switch cell through the first pre-output stage capacitor;
initiating an output stage of the charge pump connected to at least one of the first pre-output stage or another pre-output stage of the charge pump, wherein the output stage includes an output-stage switch cell connected to an output-stage capacitor, to facilitate generating an output voltage based at least in part on a voltage generated by the first pre-output stage;
generating a gate voltage for application to a gate of a first charge transfer switch (CTS) of the first switch cell based at least in part on the respective switching states of a first transistor and a second transistor of the first switch cell; and applying the gate voltage to the gate of the first CTS to facilitate controlling switching of the first CTS to facilitate generating the voltage by the first pre-output stage.

16. The method of claim 15, further comprising:
applying a high clock signal to a gate of the first transistor;
generating the gate voltage for application to the first CTS based at least in part on the high clock signal applied to the gate of the first transistor; and
switching on the first CTS in response to the gate voltage applied to the first CTS.

17. The method of claim 16, further comprising:
applying a low clock signal to the gate of the first transistor;
switching on the second transistor to facilitate applying a specified voltage to the gate of the first CTS, in response to the first transistor being switched off; and
switching off the first CTS in response to the application of the specified voltage to the gate of the first CTS.

18. The method of claim 15, further comprising:
connecting the node B associated with the first switch cell of the first pre-output stage to a power supply, wherein the first switch cell comprises the first CTS, the first transistor, and the second transistor;
connecting a positive terminal of the first pre-output stage capacitor to the node A associated with the first switch cell, wherein the node A associated with the first switch cell is at a higher voltage than the node B associated with the first switch cell when the first CTS is switched off; and
connecting a negative terminal of the first pre-output stage capacitor to the node B associated with the second switch cell.

19. The method of claim 18, further comprising:
connecting a node B associated with a third switch cell to the positive terminal of the first pre-output stage capacitor, wherein the third switch cell is part of a second pre-output stage of the charge pump;
connecting a positive terminal of a second pre-output stage capacitor to a node A associated with the third switch cell, wherein the node A associated with the third switch cell is at a higher voltage than the node A associated with the first switch cell when a second CTS is switched off;
connecting a negative terminal of the second pre-output stage capacitor to a node B associated with a fourth switch cell that is part of the second pre-output stage;
connecting a node B associated with the output-stage switch cell to the positive terminal of the second pre-output stage capacitor; and
connecting a positive terminal of the output-stage capacitor to a node A associated with the output-stage switch cell.

20. The method of claim 19, further comprising:
applying a first clock signal to the first switch cell, the fourth switch cell, and the output-stage switch cell; and
applying a second clock signal to the second switch cell and the third switch cell.

21. A system, comprising:
means for configuring a first pre-output stage of a charge pump, wherein the first pre-output stage comprises a first switch cell, a second switch cell, and a first pre-output stage capacitor, the first switch cell and the second switch cell respectively include a node A and a node B, and the node A of the first switch cell is connected to the node B of the second switch cell through the first pre-output stage capacitor;
means for configuring an output stage of the charge pump connected to at least one of the first pre-output stage or another pre-output stage of the charge pump, wherein the output stage includes an output-stage switch cell connected to an output-stage capacitor, to facilitate generating an output voltage based at least in part on a voltage generated by the first pre-output stage;
means for generating a gate voltage for application to a gate of a first charge transfer switch (CTS) of the first switch cell based at least in part on the respective switching states of a first means for switching and a second means for switching associated with of the first switch cell; and
means for applying the gate voltage to the gate of the first CTS to facilitate controlling switching of the first CTS to facilitate generating the voltage by the first pre-output stage.

22. The system of claim 21, further comprising:
the first means for switching that switches on in response to a received high clock signal to generate the gate voltage that is applied to the gate of the first CTS to switch the first CTS to an on state to facilitate transfer of a received voltage from the node B of the first switch cell across the first CTS to the node A of the first switch cell, wherein the first means for switching switches to an off state in response to a low clock signal; and
the second means for switching that switches to an on state when the first means for switching is switched to the off state, wherein when the second means for switching is switched to the on state, the second means for switching applies the received voltage to the gate of the first CTS to switch the first CTS to an off state.

23. The system of claim 22, further comprising:
first means for controlling switching that comprises the first means for switching and the second means for switching, wherein the first means for controlling switching controls switching of the first CTS to control the transfer of the received voltage from the node B of the first switch cell to the node A of the first switch cell;
second means for controlling switching that controls switching of a second CTS that is part of the second switch cell, wherein the first CTS is connected to a first terminal of the first pre-output capacitor and the second CTS is connected to a second terminal of the first pre-output capacitor;
third means for controlling switching that controls switching of a third CTS, which is part a third switch cell, to facilitate transfer of a first stepped-up voltage at a node B of the third switch cell to a node A of the third switch cell, wherein the first stepped-up voltage is based at least in part on voltage at the node A the first switch cell;
fourth means for controlling switching that controls switching of a fourth CTS, which is part of a fourth switch cell, wherein the third CTS is connected to a first terminal of a second pre-output capacitor and the fourth CTS is connected to a second terminal of the second pre-output capacitor; and
fifth means for controlling switching that controls switching of a fifth CTS, which is part of the output-stage switch cell, to facilitate transfer of a second stepped-up voltage at a node B of the output-stage switch cell to a node A of the output-stage switch cell, to facilitate increasing the output voltage based at least in part on the second stepped-up voltage, wherein the second stepped-up voltage is based at least in part on the first stepped-up voltage.

* * * * *